United States Patent [19]

Saito et al.

[11] Patent Number: 4,700,015
[45] Date of Patent: Oct. 13, 1987

[54] INSULATING STRUCTURE FOR AN EXTERNAL TERMINAL

[75] Inventors: Yasuaki Saito, Kyoto; Tooru Harada; Masato Fujino, both of Nagaokakyo, all of Japan

[73] Assignee: Murata Manufacturing Co., Ltd., Kyoto, Japan

[21] Appl. No.: 916,393

[22] Filed: Oct. 7, 1986

[51] Int. Cl.[4] ............................................. H05K 5/02
[52] U.S. Cl. ................................. 174/50; 174/138 F
[58] Field of Search .................. 174/50.56, 92, 137 R, 174/138 R, 138 F, 155, 156, 50; 333/185; 338/226, 232; 339/140 R, 140 C, 141, 208

[56] References Cited

U.S. PATENT DOCUMENTS 4,337,374 6/1982 Smith ............................ 174/138 F Primary Examiner—Laramie E. Askin
Attorney, Agent, or Firm—Wenderoth, Lind & Ponack

[57] ABSTRACT

An insulating structure for an external terminal of an electronic part is formed of two insulating housing parts abutting along a junction to define an insulating housing for an electronic part. There is an insulating projection on each housing part and projecting outwardly of the housing from the corresponding housing part, each projection having a U-shaped cross-section with the open sides of the projections facing each other with one projection inside the other and the cross-sections telescopingly interfitted. One of the projections has a cross-section extending into the wall of the corresponding housing part from the junction and the other projection has the cross-section projecting from the junction toward the one projection. The wall of one of said housing parts has a first wall portion extending into the end of the corresponding projection where it extends from the housing part, and this wall portion has a recess therein facing toward the projection on the other housing part, and the wall of the other of the housing parts has a second wall portion extending into the end of the corresponding projection where it extends from the housing part and fitting into the recess in said first wall portion. The recess and second wall portion fit tightly around the terminal of the electronic part. A metallic casing around the insulating housing has an opening therein with the edges of the opening abutting the outside surface of the projections. Leakage current from the terminal to the metallic casing must traverse a long path through the compactly arranged projections.

1 Claim, 6 Drawing Figures

INSULATING STRUCTURE FOR AN EXTERNAL TERMINAL

The present invention relates to an insulating structure for an external terminal of an electronic part, for example, a line filter, having an external terminal projecting outwardly from the inside of a metallic casing.

FIG. 5 is a partially cutaway side view of a line filter showing a conventional insulating structure for the external terminal and FIG. 6 is a front view thereof.

A line filter 1 comprises two insulating casings 4a and 4b, the filter elements (not shown) comprising L, C or LC elements are housed in the insulating casings 4a and 4b, insulated from each other, and the casings are housed in a metallic casing 2, so that two input or output external terminals 10 (one of them is not shown) connected to the respective filter elements project outwardly from an opening 3 in the metallic casing 2. An insulating structure for the projecting external terminal is provided.

Insulating projections 8a and 8b having a U-shape cross-section are provided at opposed positions at the junction (the junction surfaces) of the insulating casings 4a and 4b, and the external terminal 10 is put therebetween, enclosed by the two insulating projections 8a and 8b, and the projections 8a and 8b project outwardly from the opening 3 in the metallic casing 2.

When the external terminal 10 extends out of the metallic casing 2 as above-described, it is necessary for safety to provide a predetermined creeping distance between the external terminal 10 and the metallic casing 2.

The above construction, however, has the junction 6 and the insulating projections 8a and 8b aligned with the junction 6 of the insulating casings 4a and 4b so that the creeping distance $L_1$ between the terminal 10 and the casing 2 is straight (the portion shown by the thick line in FIG. 6) from the terminal 10 between portions 8a and 8b to casing 2, and the other creeping distance, as shown by $L_2$ in FIG. 6, corresponds to the distance extending over the inside, the end and the outside of the insulating projections 8a and 8b, the breakdown voltage being the voltage necessary to break down the dielectric along the shorter of the above two distances.

In this case, in order to ensure the presence of a predetermined creeping distance, the distance $L_2$, which includes the distance outwardly along projections 8a and 8b, is easy to make larger than $L_1$, but the insulating projections 8a and 8b must have a large width $W_1$ to keep the distance $L_1$ larger, which will enlarge the configuration of the line filter 1 itself, resulting in a high manufacturing cost.

Accordingly, an object of the present invention is to provide an insulating structure for an external terminal which can ensure a large creeping distance between the external terminal and the metallic casing, thereby providing an improvement in safety.

Another object of the present invention is to provide an insulating structure for an external terminal which can ensure a large creeping distance without enlarging the size of each insulating projection, thereby making it possible to further miniaturize the electronic parts.

A further object of the present invention is to provide an insulating structure for an external terminal which is small-sized to achieve a low manufacturing cost of the electronic parts.

The above and other objects and features of the invention will appear more fully hereinafter from a consideration of the following description taken in connection with the accompanying drawings wherein one embodiment is illustrated by way of example.

DETAILED DESCRIPTION OF THE INVENTION

Figure 1:
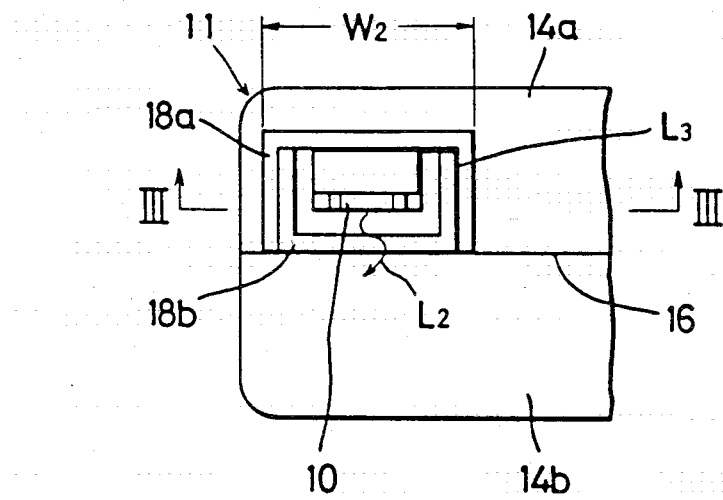
FIG. 1 is a partially cutaway front view of a line filter using an insulating structure of the present invention, from which the metallic casing has been removed.
Figure 2:
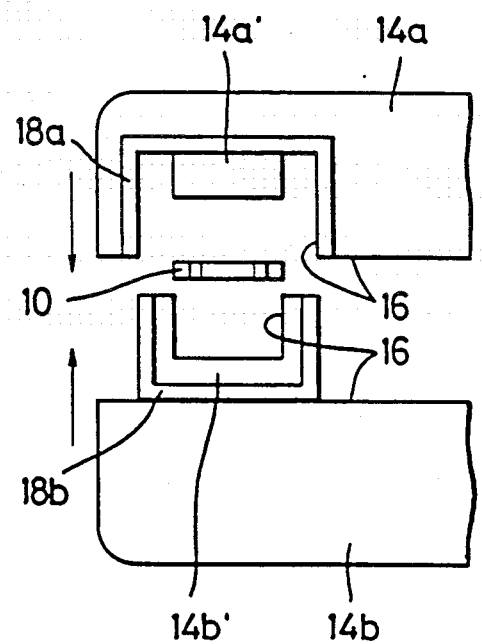
FIG. 2 is an exploded front view of the line filter in FIG. 1.
Figure 3:
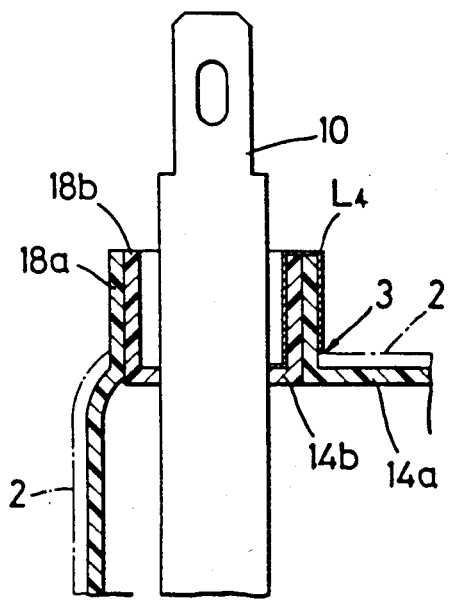
FIG. 3 is a sectional view taken on the line III—III in FIG. 1.
Figure 4:
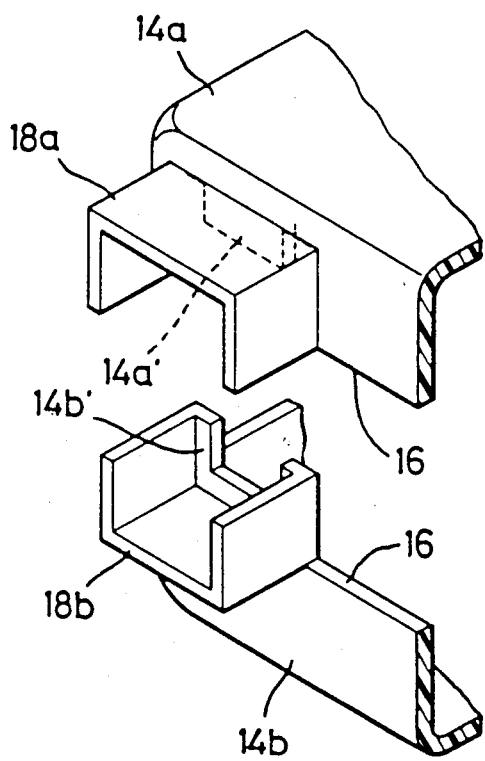
FIG. 4 is a perspective exploded view of the structure of the insulating projection.

FIGS. 1 through 4 are views exemplary of a line filter 11 which is an electronic part provided with an external terminal 10. The insulating structure for the external terminal 10 at the line filter 11 is similar to the conventional insulating structure in that at the junction (the junction surfaces) 16 of insulating casings 14a and 14b and at positions opposed to each other are provided insulating projections 18a and 18b each having a U-shape cross-section, and in that the external terminal 10 is between the insulating casings 14a and 14b, enclosed by the insulating projections 18a and 18b, and projects outwardly from an opening 3 in a metallic casing 2 (shown in phantom lines in FIG. 3). However, the structure for insulating the external terminal 10 is different from the conventional one in that one insulating projection 18a provided on one insulating casing 14a is recessed from the junction surface 16 and is open at the side facing the other insulating projection 18b and has a U-shaped cross section. The other insulating projection 18b provided on the other insulating casing 14b projects from the junction surface 16 and has a U-shaped cross-section and is open at the side facing the insulating projection 18a. Moreover, the inner size of the insulating projection 18a receives snugly therein the insulating projection 18b so that, when both the insulating casings 14a and 14b are abutting each other at the junction surfaces 16 the insulating projection 18b telescopes laterally into projection 18a.

Also, at the inner end of projection 18b is an extension of the insulating casing 14b enclosed by the insulating projection 18b forming a U-shaped recessed wall 14b' and a portion of the insulating casing 14a enclosed by the inner end of the insulating projection 18a forms a projecting plate 14a' which fits into the space defined by recessed wall 14b', the wall 14b' and plate 14a' engaging with each other when the insulating casings 14a and 14b are telescoped, whereby the external terminal 10, as shown in FIG. 1, is sandwiched between the bottom of wall 14b' and the edge of plate 14a'.

Figure 6:
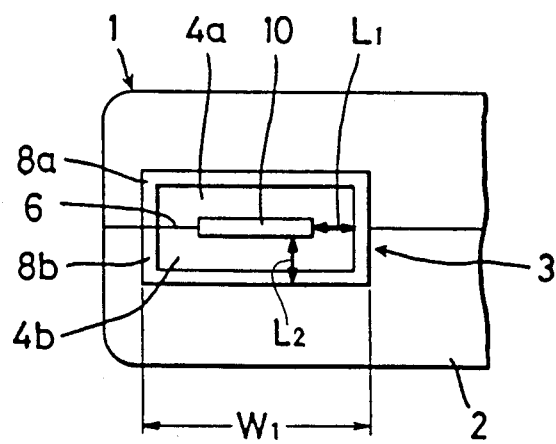
FIG. 6 is a front view of the line filter in FIG. 5.

In this embodiment, the creeping distance between the external terminal 10 and the metallic casing 2 is (1) the distance $L_2$ (refer to FIG. 1) similar to FIG. 6 including the length of projecting portions 18a and 18b; (2) the distance $L_3$ (the thick line portion in FIG. 1) bent in a U-shape because of the bent shape of junction 16 when it extends through the projections 18a and 18b; and (3) the distance $L_4$ (the thick line portion in FIG. 3) including the width and length of projections 18a and 18b, whereby the breakdown voltage is that along shortest distance among the distances $L_2$ to $L_4$.

Figure 5:
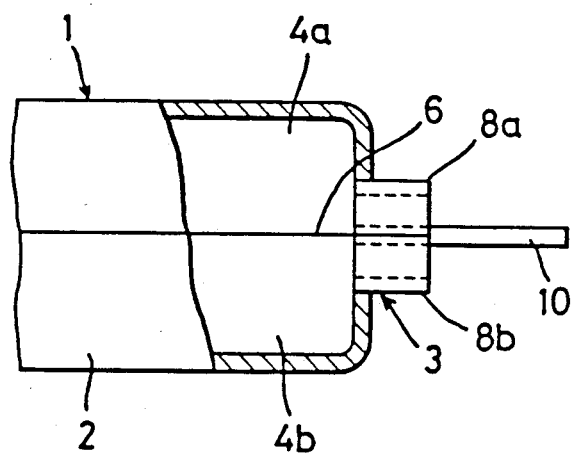
FIG. 5 is a partially cutaway side view of a line filter using the conventional insulating structure for an external terminal.

In this case, the distances $L_2$ and $L_4$, which include the length of the projecting portions 18a and 18b, can be made larger with ease (in other words, without increasing the width of each insulating projection 18a or 18b and the size of the line filter 11 itself) and also the distance $L_3$, which is different from the conventional distance $L_1$ (see FIG. 5) in bending, is easy to make larger.

In addition, creeping distances corresponding to distances $L_2$ to $L_4$ are, of course, formed at positions not particularly shown by the thick line but symmetrical to the distances $L_2$ to $L_4$ putting therebetween the external terminal 10 and shown by the thick line in the drawings.

Hence, the above-described construction can reduce the width $W_2$ of the insulating projection 18a (and the width of the insulating projection 18b) while ensuring a necessary creeping distance, thereby enabling the line filter 11 to be made small-sized. Furthermore, such miniaturization can result in a low manufacturing cost of the product.

Incidentally, the present invention is not confined to the aforesaid embodiment of the line filter. Hence, the present invention is, of course, applicable widely to an insulating structure which is provided at opposed positions at the junction of two insulating casings with insulating projections of U-shaped cross-section respectively, so that an external terminal is sandwiched between both the insulating casings, enclosed by both the insulating projections, and projects outwardly from an opening in a metallic casing.

While a preferred embodiment of the invention has been described using specific terms, such description is for illustrative purpose only, and it is to be understood that changes and variations may be made without departing from the spirit or scope of the following claims.

We claim:

1. An insulating structure for an external terminal of an electronic part, comprising:

two insulating housing parts abutting along a junction to define an insulating housing for an electronic part having a terminal positioned to project out of said housing;

an insulating projection on each housing part and projecting outwardly of said housing from the corresponding housing part, each projection having a U-shaped cross section with the open sides of the projections facing each other with one projection inside the other and the cross-sections telescopingly interfitted, one of said projections having the cross-section extending into the wall of the corresponding housing part from said junction and the other projection having the cross-section projecting from said junction toward the one projection, the wall of one of said housing parts having a first wall portion extending into the end of the corresponding projection where it extends from the housing part, said first wall portion having a recess therein facing toward the projection on the other housing part, and the wall of the other of said housing parts having a second wall portion extending into the end of the corresponding projection where it extends from the housing part and fitting into said recess in said first wall portion and leaving a spece between the outer end thereof and the bottom of said recess for tightly fitting around the terminal of said electronic part; and a metallic casing around said insulating housing having an opening therein with the edges of said opening abutting to outside surface of said projections.

* * * * *